US006835991B2

(12) United States Patent
Pell, III

(10) Patent No.: US 6,835,991 B2
(45) Date of Patent: Dec. 28, 2004

(54) METHOD AND APPARATUS FOR IMPROVING RESOLUTION OF OBJECTS IN A SEMICONDUCTOR WAFER

(76) Inventor: Edwin A. Pell, III, 216 Long Pond Rd., Rhinebeck, NY (US) 12572

(*) Notice: Subject to any disclaimer, the term of this patent is extended or adjusted under 35 U.S.C. 154(b) by 0 days.

(21) Appl. No.: 10/291,919

(22) Filed: Nov. 7, 2002

(65) Prior Publication Data

US 2003/0054604 A1 Mar. 20, 2003

Related U.S. Application Data

(62) Division of application No. 09/841,762, filed on Apr. 24, 2001, now Pat. No. 6,524,870.

(51) Int. Cl.[7] .............................................. H01L 31/00
(52) U.S. Cl. .................... 257/448; 257/713; 257/777
(58) Field of Search ................................. 257/448, 451, 257/713, 723, 777

(56) References Cited

U.S. PATENT DOCUMENTS

| | | | |
|---|---|---|---|
| 4,348,105 A | * | 9/1982 | Caprari |
| 5,508,803 A | * | 4/1996 | Hibbs et al. |
| 5,864,162 A | | 1/1999 | Reedy et al. |
| 5,872,380 A | | 2/1999 | Rostoker et al. |
| 6,136,652 A | | 10/2000 | Hazani |
| 6,143,655 A | | 11/2000 | Forbes et al. |
| 6,150,256 A | | 11/2000 | Furukawa et al. |
| 6,189,131 B1 | | 2/2001 | Graef et al. |
| 6,209,123 B1 | | 3/2001 | Maziasz et al. |
| 6,221,751 B1 | | 4/2001 | Chen et al. |
| 6,245,083 B1 | | 6/2001 | Liu |
| 6,262,426 B1 | | 7/2001 | Zafiratos |
| 6,294,460 B1 | | 9/2001 | Subramanian et al. |
| 6,338,922 B1 | | 1/2002 | Liebmann et al. |
| 6,344,379 B1 | | 2/2002 | Venkatraman et al. |
| 6,365,509 B1 | | 4/2002 | Subramanian et al. |

OTHER PUBLICATIONS

Asai, S. et al., "High performance optical lithography using a separated light source," J. Vac. Sci. Technol. B 10(6), Nov./Dec. 1992.

Garofalo, J. et al., "Mask assisted off–axis illumination technique for random logic," J. Vac. Sci. Technol. B 11(6), Nov./Dec. 1993.

Liu, Y. et al., "Binary and Phase–shifting Image Design for Optical Lithography," SPIE vol. 1463 Optical/Laser Microlithography IV (1991).

Liu, Y. et al., "Binary and Phase Shifting Mask Design for Optical Lithography," IEEE Transactions on Semiconductor Manufacturing, 5(2), May 1992.

Nashold, K. et al., "Image construction through diffraction–limited high–contrast imaging systems: an iterative aproach," J. Opt. Soc. Am. A, 2(5), May 1985.

Saleh, B. et al., "Image construction: optimum amplitude and phase masks in photolithography," Applied Optics, 24(10), May 15, 1985.

Saleh, B. et al., "Pre–inverse filtering of distorted images," Applied Optics, 20(22), Nov. 15, 1981.

(List continued on next page.)

Primary Examiner—Phuc T. Dang
(74) Attorney, Agent, or Firm—Christensen O'Connor Johnson Kindness PLLC

(57) ABSTRACT

A method and apparatus for creating objects on a semiconductor wafer includes a mask/reticle having a substantially uniform pattern of features. The wafer is illuminated through the mask/reticle to create a corresponding uniform pattern of objects on the wafer. Selected objects created by the uniform pattern of features are then utilized to provide desired electrical functions on the integrated circuit. In one embodiment of the invention, the objects are interconnect wires formed by a mask or reticle having a substantially uniform pattern of strips that extends over an area of the integrated circuit. Interconnect wires of different lengths are created by defining endpoints on the strips or by exposing areas on the wafer corresponding to the endpoints of the wires.

7 Claims, 6 Drawing Sheets

OTHER PUBLICATIONS

Saleh, B. et al., "Reduction of errors of microphotographic reproductions by optimal corrections of original masks," Optical Engineering, 20(5), Sep./Oct. 1981.

Prouty, M., "Optical Imaging with Phase Shift Masks," SPIE vol. 470, Optical Microlithography III: Technology for the Next Decade, 1984.

Tamechika, E., "Resolution Improvement Using Auxiliary Pattern Groups in Oblique Illumination Lithography," Jpn. J. Appl. Phys., vol. 32 (1993) pp. 5856–5862, Part I, No. 12B, Dec. 1993.

Terasawa, T. et al., "0.3–micron optical lithography using a phase–shifting mask," SPIE vol. 1088, Optical/Laser Microlithography II, 1989.

Terasawa, T. et al., "Improved resolution of an I–line stepper using a phase–shifting mask," J. Vac. Sci. Technol. B 8(6), Nov./Dec. 1990.

Wyant, J., "Image Processing I," J. Opt. Soc. Am. 70(12), 1580, 1980.

* cited by examiner

METHOD AND APPARATUS FOR IMPROVING RESOLUTION OF OBJECTS IN A SEMICONDUCTOR WAFER

CROSS-REFERENCE TO RELATED APPLICATION

This application is a divisional of prior application Ser. No. 09/841,762, filed Apr. 24, 2001 now U.S. Pat. No. 6,524,870, priority from the filing date is of which is hereby claimed under 35 U.S.C. § 120.

FIELD OF THE INVENTION

The present invention relates to photolithographic processing, and in particular to methods of controlling the formation of objects on a semiconductor wafer.

BACKGROUND OF THE INVENTION

Most modern integrated circuits are created by photolithographic techniques whereby selected portions of a silicon wafer are exposed to illumination light. The particular areas that are exposed on the wafer are generally determined by a mask or reticle having opaque and clear areas that block or pass the illumination light.

As the size of the features to be created on the wafer become smaller and smaller, the features can become distorted due to optical effects, such as diffraction or destructive interference of the light passing through the mask or reticle. Another distortion can occur as a result of setting the exposure time/intensity for the wafer. FIG. 1 illustrates a portion of a semiconductor mask or reticle having a number of elements 10 that are relatively widely spaced or isolated from one another. For example, these elements may represent interconnect wires to be created within an integrated circuit. Additionally, the mask or reticle includes a number of elements 12 that are closely grouped with one another. If the exposure of the mask or reticle is set such that the isolated elements 10 are properly imaged on the wafer, then it often happens that the relatively closely grouped elements 12 will be incorrectly exposed. Conversely, if the exposure of the mask or reticle is set such that the closely grouped elements 12 are properly formed on the wafer, then the isolated elements 10 will be incorrectly exposed. In many instances, it is virtually impossible to select an exposure of the mask or reticle that will optimize the formation of closely grouped and isolated circuit elements on a wafer.

SUMMARY OF THE INVENTION

To address the problems discussed above, the present invention is a method for controlling the creation of closely spaced objects on a wafer during photolithographic processing. A mask or reticle has a substantially uniform pattern of features disposed thereon and the exposure of the mask or reticle is chosen such that objects created by the uniform feature pattern is optimized. The uniform pattern of features on the mask/reticle creates a corresponding uniform pattern of objects on a wafer. Selected objects can then be used as desired to provide the desired functionality.

In one embodiment of the invention, the substantially uniform feature pattern comprises a number of uniformly spaced lines that form interconnect wires on an integrated circuit. Interconnect wires of specific lengths are created by terminating the lines at desired points on the mask or reticle. Alternatively, wire of specific length can be created by exposing the wafer at the desired endpoints of the wires.

In another embodiment of the invention, the circuit elements to be created are gate electrodes. A mask or reticle has substantially uniform pattern of strips that create gate electrodes over semiconductor wells. Individual gate electrodes are made by terminating the lines at desired locations either on the mask or reticle itself, or on the wafer.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

To eliminate the problems associated with selecting an exposure duration/intensity of a mask/reticle that includes both isolated and closely spaced features, the present invention utilizes a substantially uniform pattern of features on a mask or reticle to create a corresponding uniform pattern of objects on a wafer. Because each of the features is relatively uniformly spaced, each object created from a feature is formed in the same way on the surface of the wafer due to the same exposure conditions of the mask or reticle.

Figure 1:
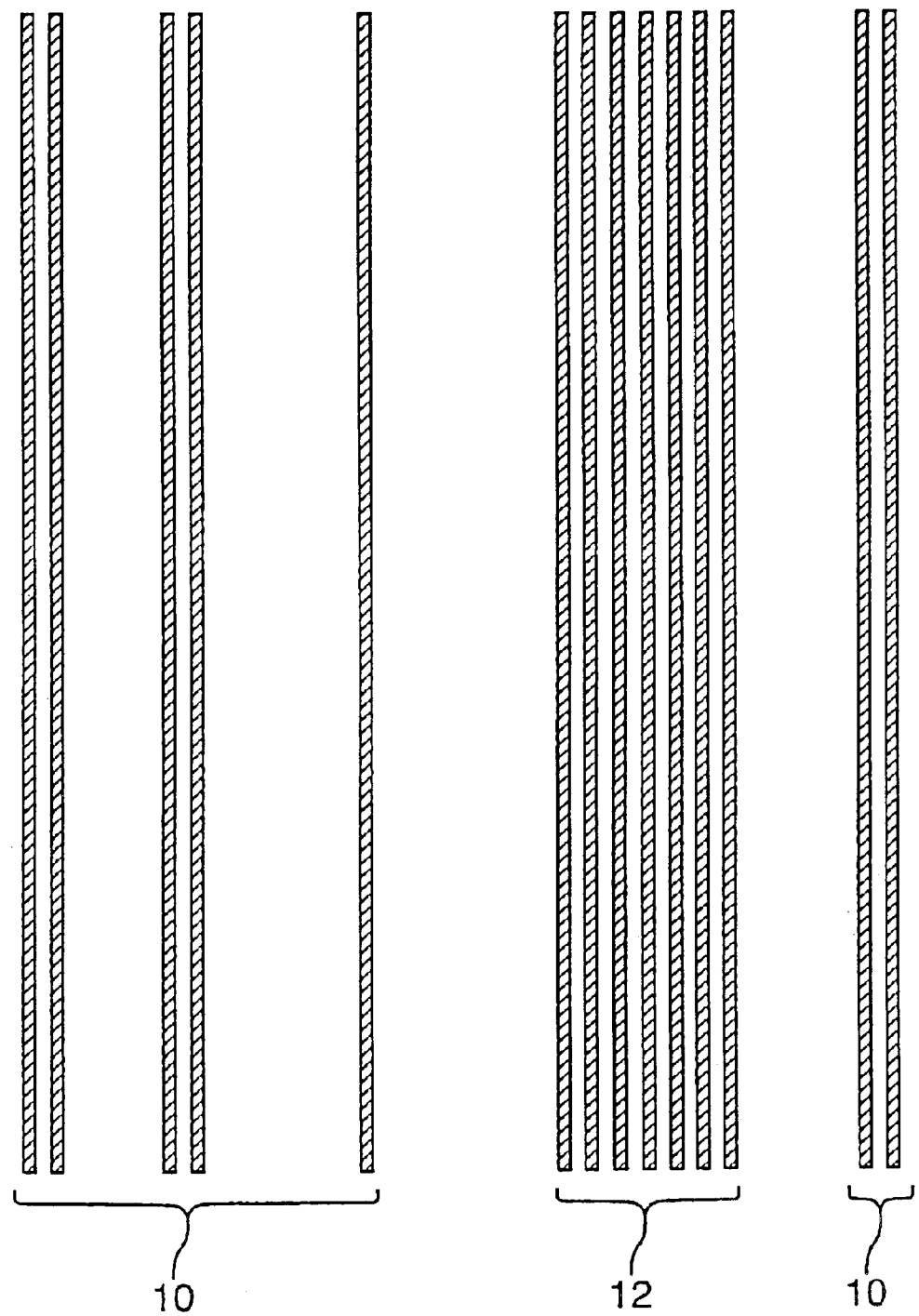
FIG. 1 illustrates a conventional method of forming objects on a wafer with a mask/reticle that includes isolated and closely grouped features.
Figure 2:
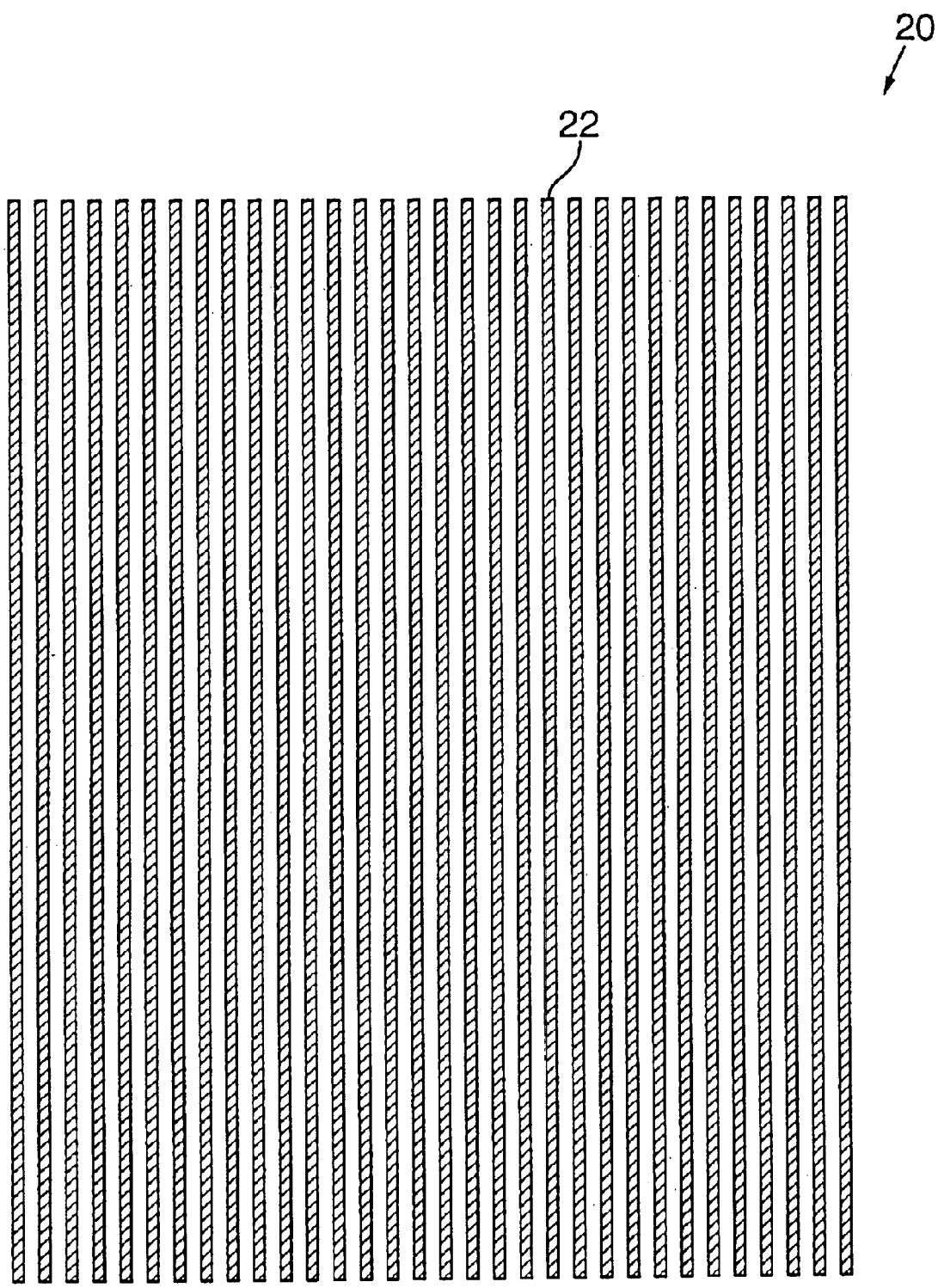
FIG. 2 illustrates a uniform pattern of features on a mask or reticle that can be used to create interconnect wires in an integrated circuit in accordance with one embodiment of the present invention.

FIG. 2 shows a portion of a mask or reticle 20 having a substantially uniform pattern of features 22 that create a corresponding uniform pattern of objects on a semiconductor wafer. In the example shown, the features are strips that create interconnect wires on the wafer.

Figure 3:
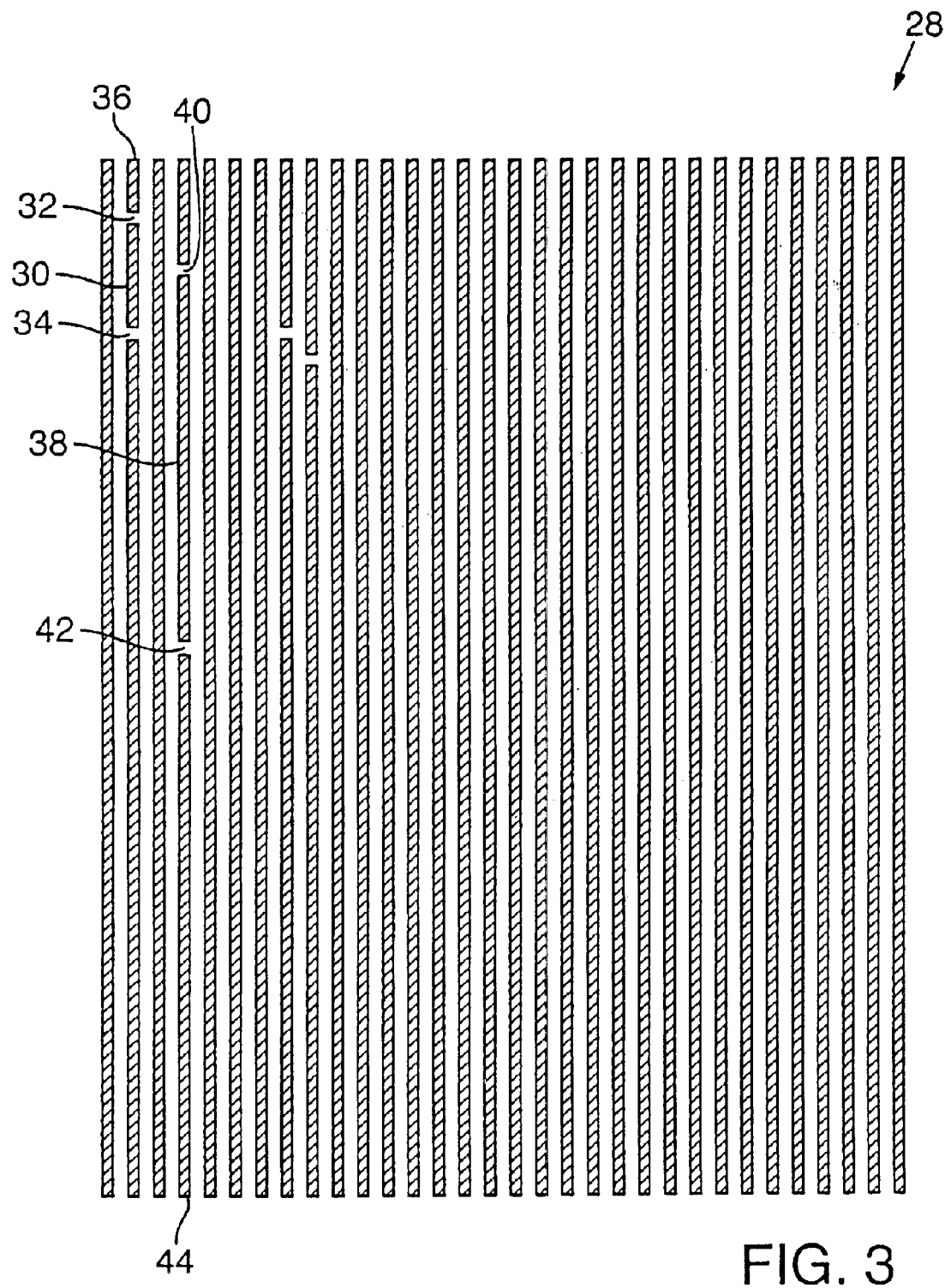
FIG. 3 illustrates one method for creating wires of different lengths on a wafer using the uniform pattern of features shown in FIG. 2.

Interconnect wires of various lengths can be made by making endpoints on the strips on the mask or reticle as desired. For example, FIG. 3 shows a mask or reticle that creates a short wire 30 by placing endpoints 32 and 34 in the feature 36. A longer wire 38 is created by placing endpoints 40, 42 in a feature 44, etc.

In order to route signals to desired locations within an integrated circuit, two patterns of interconnect are formed on different layers within the wafer using two or more masks/reticles of the type shown in FIGS. 2 and 3 and that are oriented at any angle with respect to each other, usually at 90°. Individual interconnect wires in the two layers are connected together with vias in order to direct signals to desired locations within an integrated circuit.

Figure 4:
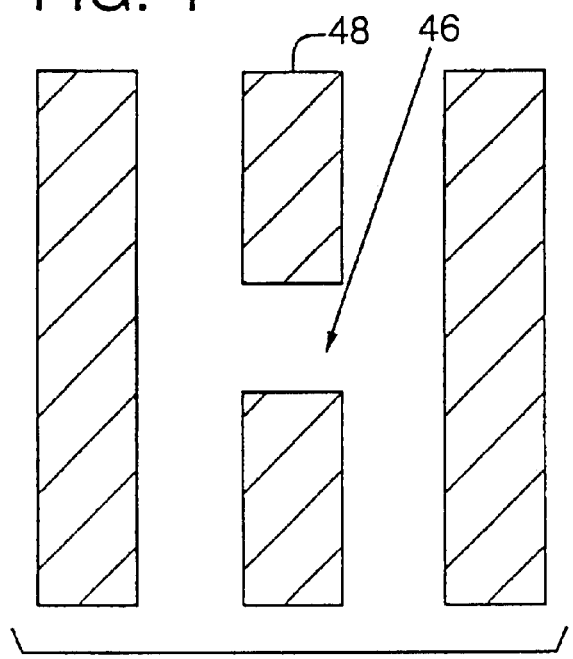
FIG. 4 is a close up view of an endpoint of a feature as shown in FIG. 3.
Figure 5:
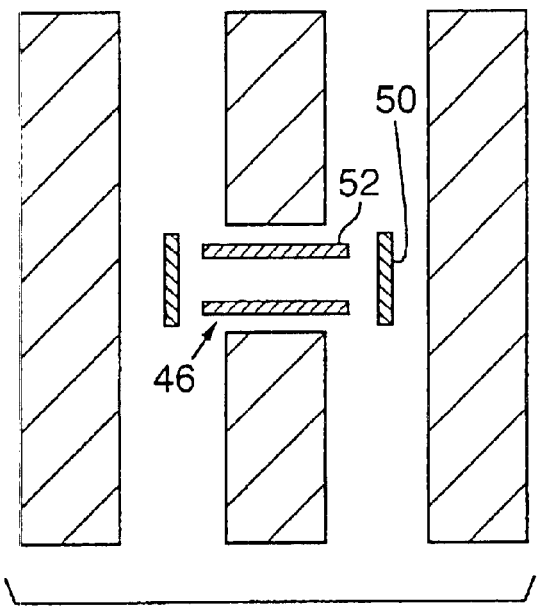
FIG. 5 shows how scattering bars can be added to the an endpoint of a feature to improve resolution on a wafer.

FIG. 4 shows in detail an endpoint 46 that is created in a feature of a mask/reticle. Depending upon the size of the interconnect wires to be created, the endpoint 46 may be created by placing a break somewhere along the length of an individual strip on the mask/reticle. However, in many instances, the pattern on the wafer created by the endpoint 46 may become distorted when the features are closely spaced on the mask/reticle. Therefore, it may be advisable to place one or more scattering bars 50 adjacent the endpoint as shown in FIG. 5. As is well known to those of ordinary skill in the art, the use of scattering bars enhances the resolvability of objects created on the wafer. The scattering bars themselves are generally too small to be resolved on the wafer.

Even with some of the features in the mask/reticle 28 shown in FIG. 3 having a number endpoints along their length, the features are still similar enough so that the objects on the wafer will be uniformly formed when the mask/reticle is exposed.

By using a mask/reticle of the type shown in FIGS. 2 and 3, it will be appreciated that more interconnect wires are formed on the wafer than may be necessary. The unused wires can be connected to a common power or ground source for shielding and inductance reduction or could be left uncoupled in the integrated circuit.

Figure 6:
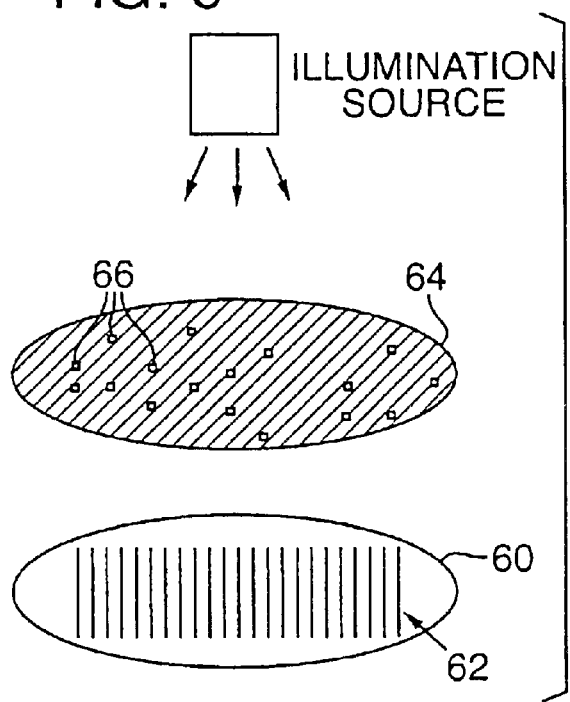
FIG. 6 illustrates another method for creating wires of different lengths on a wafer in accordance with another aspect to the present invention.

FIG. 6 shows a mask or reticle 60 having a uniform pattern of features 62 without endpoints in order to create a corresponding uniform pattern of objects on a semiconductor wafer. To create wires of different lengths, another mask/reticle 64 can be used having areas 66 that are placed at specific locations in order to expose the wafer at the location of the desired endpoints of an interconnect wire. The advantage of using the system shown in FIG. 6 is that the same mask/reticle 60 can be used for a number of different integrated circuits and is not specific to any one circuit design.

In yet alternative embodiment of the invention, the endpoints of the interconnect wires can be created using a direct writing laser or other exposure source on the wafer itself. Because the endpoints of the wires are relatively few compared to the size of the chip, direct writing each of the endpoints of the objects will greatly speed the direct writing of wires.

Figure 7:
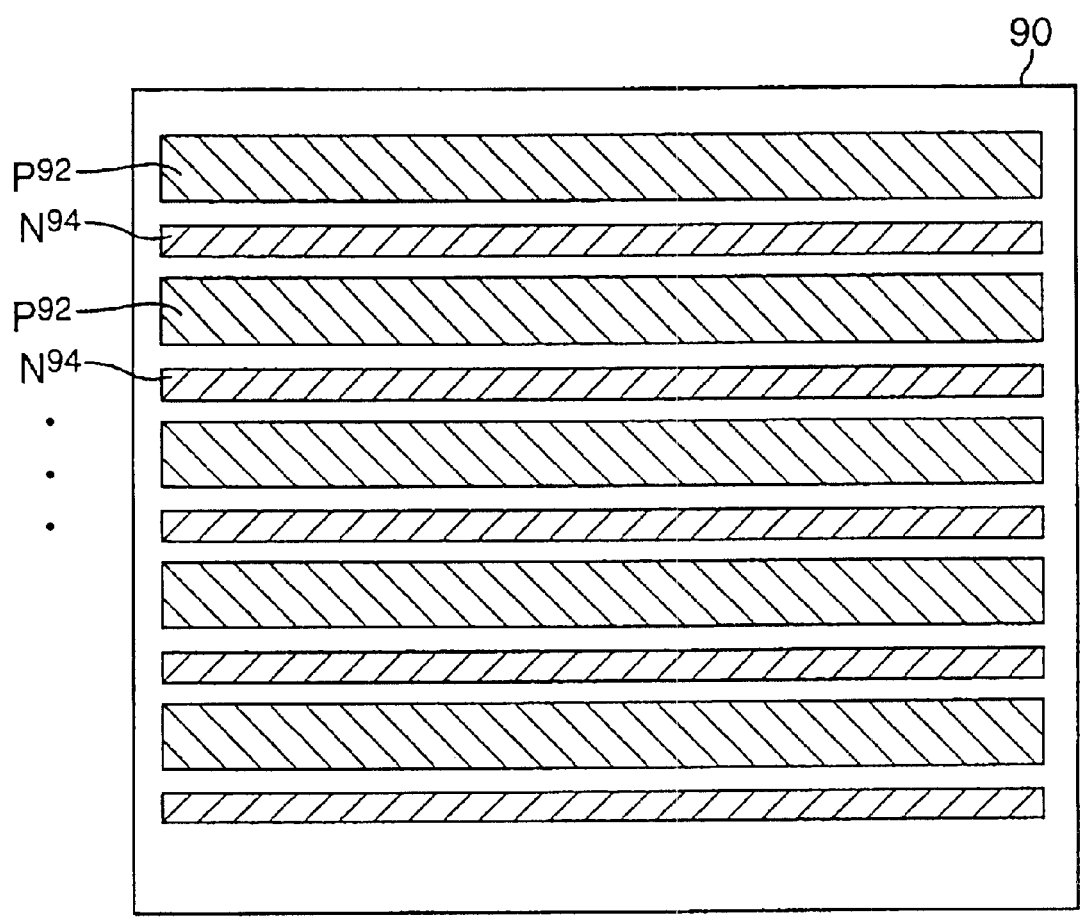
FIG. 7 illustrates an alternating pattern of P and N wells created on a wafer for creating active devices.
Figure 8:
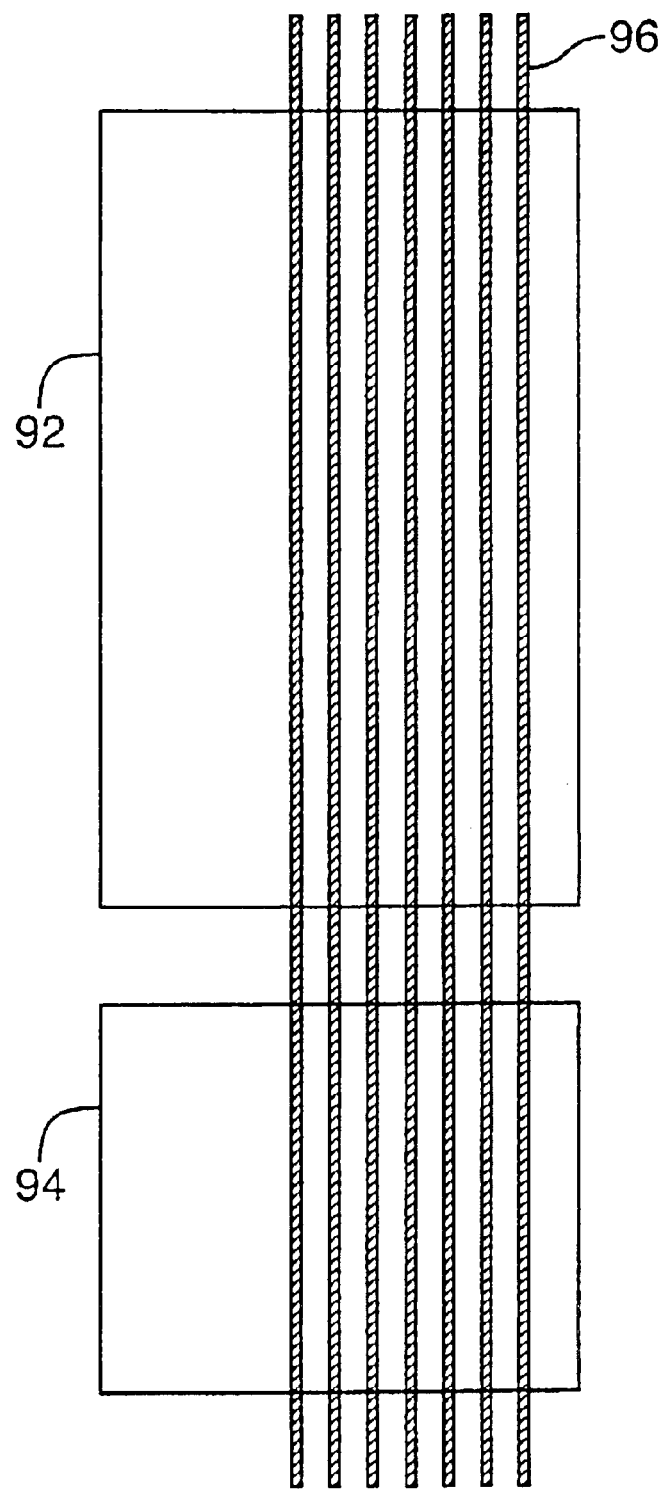
FIG. 8 illustrates how a uniform pattern of gate electrodes are created over the alternating strips of N and P wells in order to form a number of active devices on the wafer in accordance with another aspect of the present invention.

The present invention is not limited to creating interconnect wires on an integrated circuit. For example, the present invention can also be used in creating gate electrodes for active semiconductor devices. FIG. 7 shows a portion of an integrated circuit wafer 90 including alternating P wells 92 and N wells 94 that are used to make transistors on the semiconductor wafer. A pattern of gate electrodes can be formed over the N and P wells 92, 94 using a mask or reticle having a uniform pattern of features 96 as shown in FIG. 8. The features comprise a set of substantially uniform parallel strips that extend over the area of the integrated circuit. Individual gates can be formed by making endpoints along the length of a strip on the mask/reticle or by selectively exposing an area of the wafer at the location of the desired endpoint of a gate created by the features. The endpoints in the features 96 can be placed such that a gate is formed over a single well or over multiple wells in accordance with the electrical characteristics of the transistor to be created. By placing rows of features 96 on the mask/reticle, each of the gates is formed in a similar manner due to the same exposure conditions of the mask/reticle.

Although the present invention has been described with respect to interconnect wires and gate electrodes on a semiconductor wafer, it would be appreciated that the technique can be applied to forming other devices on an integrated circuit. By exposing a wafer with a mask or reticle including a uniform pattern of features to be created and selectively coupling or enabling particular devices created from the uniform patters of features at desired locations on the wafer, the distortions normally associated with exposing isolated and grouped features on a mask/reticle are reduced or eliminated. Furthermore, it is not necessary that the uniform pattern of features on the mask/reticle extend over the entire area of the integrated circuit. For example, the mask/reticle may include a pattern of features that creates corresponding objects in only a portion of the integrated circuit area. However, the pattern of features on the mask/reticle should have substantially identical exposure characteristics.

The embodiments of the invention in which an exclusive property or privilege is claimed are defined as follows:

1. A mask/reticle for creating a pattern of circuit components of an integrated circuit formed on a semiconductor wafer, comprising a substantially uniform pattern of features that, when exposed on a semiconductor wafer, creates a corresponding uniform pattern of circuit components of an integrated circuit wherein at least some of the circuit components are used in the integrated circuit.

2. The mask/reticle of claim 1, wherein the features are a pattern of parallel strips that extend over an area of the integrated circuit to create a corresponding pattern of interconnect wires on the integrated circuit.

3. The mask/reticle of claim 2, wherein selected strips have endpoints disposed along their length to define the length of a corresponding interconnect wire on the integrated circuit.

4. The mask/reticle of claim 2, further comprising:
a second mask/reticle having areas that expose the semiconductor wafer at selected points corresponding to desired endpoints of selected interconnect wires.

5. The mask/reticle of claim 1, wherein the circuit components created on the semiconductor wafer are gate electrodes, and wherein the features are a pattern of parallel strips that form gate electrodes over semiconductor wells on the semiconductor wafer.

6. The mask/reticle of claim 5, wherein selected strips have endpoints along their length to create electrodes of different sizes on the integrated circuit.

7. An integrated circuit having a layer of circuit components that is made with a mask/reticle of claim 1.

* * * * *